United States Patent
Bishay et al.

(10) Patent No.: US 6,256,350 B1
(45) Date of Patent: Jul. 3, 2001

(54) METHOD AND APPARATUS FOR LOW COST LINE-BASED VIDEO COMPRESSION OF DIGITAL VIDEO STREAM DATA

(75) Inventors: Magued M. Bishay, Newport Beach; Behnam S. Katibian, Los Angeles, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/042,124

(22) Filed: Mar. 13, 1998

(51) Int. Cl.[7] .................................................. H04N 7/12
(52) U.S. Cl. ................................ 375/240.21; 375/240.01
(58) Field of Search ..................................... 348/384, 396, 348/391; 382/245; 375/240, 240.21

(56) References Cited

U.S. PATENT DOCUMENTS

| 4,541,012 | * | 9/1985 | Tescher ................................. 348/400 |
| 4,764,805 | * | 8/1988 | Rabbani et al. ..................... 348/396 |
| 5,341,318 | * | 8/1994 | Balkanski et al. ................... 708/402 |
| 5,537,231 | * | 7/1996 | Hisada et al. ........................ 358/530 |
| 5,543,939 | * | 8/1996 | Harvey et al. ....................... 358/426 |

FOREIGN PATENT DOCUMENTS 9307719A   4/1993   (WO) .
9810587A   12/1998  (WO) .

OTHER PUBLICATIONS

"Image Processing Circuit, IBM Technical Disclosure Bulletin," vol. 37, No. 2A, Feb. 1, 1994, p. 439/440 XP000433393.

"Method of Run Length Coding for Natural Images," IBM Technical Disclosure Bulletin, vol. 31, No. 5, Oct. 1, 1988, pp. 4–6, XP000024776.

* cited by examiner

Primary Examiner—Chris Kelley
Assistant Examiner—Allen Wong
(74) Attorney, Agent, or Firm—Christopher J. Rourk; Akin, Gump, Strauss, Hauer & Fled, L.L.P.

(57) ABSTRACT

A video compression method is provided and implemented in a pixel processing controller of a digital solid-state imaging device for maximizing throughput of digitized video data on a link between the digital solid-state imaging device and a host computer. The method performs separate luminance (Y) domain compression of the video data on a line-by-line basis, without storing video data lines or video data frames, and separate chrominance (Cr/Cb) domain averaging of the video data on a region-by-region basis without storing video data in video frames. The Y and Cr/Cb domain compression steps are implemented in the digital solid-state imaging device hardware for real time link transmission of the compressed video data to the host computer.

5 Claims, 6 Drawing Sheets

| PIXEL 0 | PIXEL 1 | PIXEL 2 | PIXEL 3 | PIXEL 4 | PIXEL 5 |
|---------|---------|---------|---------|---------|---------|
| $Y7=0$  | $Y7=1$  | $Y7=2$  | $Y7=3$  | $Y7=4$  | $Y7=5$  |
| $Y6=0$  | $Y6=1$  | $Y6=2$  | $Y6=3$  | $Y6=4$  | $Y6=5$  |
| $Y5=0$  | $Y5=1$  | $Y5=2$  | $Y5=3$  | $Y5=4$  | $Y5=5$  |
| $Y4=0$  | $Y4=1$  | $Y4=2$  | $Y4=3$  | $Y4=4$  | $Y4=5$  |
| $Y3=0$  | $Y3=1$  | $Y3=2$  | $Y3=3$  | $Y3=4$  | $Y3=5$  |
| $Y2=0$  | $Y2=1$  | $Y2=2$  | $Y2=3$  | $Y2=4$  | $Y2=5$  |
| $Y1=0$  | $Y1=1$  | $Y1=2$  | $Y1=3$  | $Y1=4$  | $Y1=5$  |
| $Y0=0$  | $Y0=1$  | $Y0=2$  | $Y0=3$  | $Y0=4$  | $Y0=5$  |
| $CB7=0$ | $CR7=0$ | $CB7=2$ | $CR7=2$ | $CB7=4$ | $CR7=4$ |
| $CB6=0$ | $CR6=0$ | $CB6=2$ | $CR6=2$ | $CB6=4$ | $CR6=4$ |
| $CB5=0$ | $CR5=0$ | $CB5=2$ | $CR5=2$ | $CB5=4$ | $CR5=4$ |
| $CB4=0$ | $CR4=0$ | $CB4=2$ | $CR4=2$ | $CB4=4$ | $CR4=4$ |
| $CB3=0$ | $CR3=0$ | $CB3=2$ | $CR3=2$ | $CB3=4$ | $CR3=4$ |
| $CB2=0$ | $CR2=0$ | $CB2=2$ | $CR2=2$ | $CB2=4$ | $CR2=4$ |
| $CB1=0$ | $CR1=0$ | $CB1=2$ | $CR1=2$ | $CB1=4$ | $CR1=4$ |
| $CB0=0$ | $CR0=0$ | $CB0=2$ | $CR0=2$ | $CB0=4$ | $CR0=4$ |

FIG. 2
PRIOR ART

METHOD AND APPARATUS FOR LOW COST LINE-BASED VIDEO COMPRESSION OF DIGITAL VIDEO STREAM DATA

BACKGROUND OF THE INVENTION

1. Field of the Invention

The present invention relates generally to image processing and more specifically pertains to a video compression algorithm for increasing the data throughput on a limited bandwidth link between a host and a digital video camera.

2. Description of Related Art

A digital image represents a two-dimensional array of samples, where each sample is called a pixel. Precision determines how many levels of intensity can be represented and is expressed as the number of bits/sample. Resolution of an image refers to its capability to reproduce fine details. Higher resolution requires more complex imaging systems to represent these images in real-time. In video systems, resolution refers to the number of line pairs resolved on the face of the display screen, expressed in cycles per picture height, or cycles per picture width. Full motion video is characterized with at least 24-Hz frames/sec, and 30 or even 60 frames/sec for high definition TV. For animation, acceptable frame rate is in the range of 15–19 frames/sec while for video telephony it is 5–10 frames/sec. Videoconferencing and interactive multimedia applications require the rate of 15–30 frames/sec.

Commercial imaging applications are surfacing in digital broadcast television, compact disk video, multimedia, video teleconferencing systems, dynamic medical imaging devices, and high definition TV. Imaging applications are time critical and computationally and data intensive, and require both the storage and transmission of enormous data sets which can be accomplished with image compression. Achieving the compression ratios necessary for digital video involves the processing of individual images to remove spatial redundancies and a motion analysis of the sequence to remove temporal redundancies.

The latest models of still and video cameras are solid-state cameras which use silicon chips for image data arrays. Since the size of the camera and the chip should be kept small, these cameras have to keep low the number of sampled image data transferred from the camera to an accompanying host image processing device. Furthermore, the mass consumers of the digital video cameras are used to viewing video images on TV at the frame rate of 30 frames per second. The currently available buses between digital video cameras and the host system have a limited bandwidth of less than 8 frames per second, which limits the number of video frames that can be transferred from the camera to the host and provides fuzzy pictures. These buses do not allow real-time video data transmission.

In order to attract the average user to purchase a digital camera, the throughput of data through a low bandwidth transmission channel between the camera and the host has to be improved by compression. The real time image processing presently involves at least three types of tradeoffs: performance versus image resolution, performance versus storage size, and performance versus input and output bandwidth. The quality of performance is influenced by the cost. Expensive compression schemes, such as MPEG, are not cost effective for low cost single chip cameras. The basic measure for the performance of a compression algorithm is compression ratio, defined as a ratio of original data size and compressed data size. There is a trade-off between the compression ratio and the picture quality. Higher compression ratios may produce lower picture quality. Quality of compression can also vary according to source image characteristics and scene content.

Therefore, there is a need for a low cost method which can improve the data bandwidth between the digital video camera and the host by applying video compression to the digital video stream before the video frame is transmitted to the host computer, which is capable of generating sharp, high quality color images in real time. Furthermore, there is a need for small and inexpensive digital solid-state video cameras capable of transferring 30 video frames per second. These cameras have to have a low gate count and low power requirements so that the size and cost of the camera is minimal.

OBJECTS AND SUMMARY OF THE INVENTION

It is a primary object of the present invention to overcome the aforementioned shortcomings associated with the prior art and to provide an image processing device which uses a low cost video compression method which is capable of generating sharp, high quality color images in real time.

Another object of the present invention is to provide a compression method which performs separate compression in the Y domain and the Cr/Cb domain.

Yet another object of the present invention is to provide a compression method with minimum computational complexity which can be implemented in hardware.

Still another object of the present invention is to provide small and inexpensive digital solid-state video cameras capable of transferring more than 20 video frames per second, which have a low gate count and low power requirements.

These as well as additional objects and advantages of the present invention are achieved by a video compression method that performs separate luminance (Y) domain compression of the video data on a line-by-line basis, without storing video data lines or video data frames, and separate chrominance (Cr/Cb) domain averaging of the video data on a region-by-region basis without storing video data in video frames. The Y and Cr/Cb domain compression steps are implemented in the digital solid-state imaging device hardware for real time link transmission of the compressed video data to the host computer.

The method of the present invention is implemented in a pixel processing controller of the digital imaging device, such as a solid-state camera, working in isochronous traffic mode in the YCbCr 4:2:0 or 4:2:2 format, and adapted for a bandwidth-limited bus with isochronous pipes, one transmitting the Y domain values and another transmitting the Cr/Cb domain values. The Y domain compression module is adapted to determine pixels in the video line which are tagged on a pixel-by-pixel basis, according to differences in the pixel luminance values, and lengths between the tagged pixels. The Cr/Cb domain compression module is adapted to calculate a single average value for a plurality of Cr locations, and a single average value for a plurality of Cb locations.

In one embodiment of the present invention the Cr/Cb domain compression module obtains a single Cr value for each four Cr values, and a single Cb value for each sixteen Cb values in the 4:2:0 format, or a single Cr value for each eight Cr values, and a single Cb value for each thirty-two Cb values in the 4:2:2 format. In another embodiment of the present invention the compressed data is encoded and codes concatenated separately in the Y domain and in the Cr/Cb domain, before the transmission to the host computer. The concatenation in the Cr/Cb domain produces alternative Cr-only lines and Cr/Cb lines, where each Cr-only line has only Cr values, and each Cr/Cb line has alternating Cr and Cb values.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 2 is a schematic illustration of the sample site positions in a frame buffer, as used in the 4:2:2 YCbCr format of FIG. 1.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide a device and a method for maximizing the throughput of digitized video data on the bandwidth-limited link between a host and a digital video camera, which preferably use the YCbCr color system.

The YCbCr color system was developed as part of Recommendation ITU-R BT.601 during the development of a worldwide digital component video standard. Y values are defined to have a nominal range of 16 to 235, and Cb and Cr values are defined to have a range of 16 to 240, with the 128 level corresponding to zero. There are several YCbCr sampling formats, such as 4:4:4, 4:2:2, 4:1:1, and 4:2:0.

Figure 1:
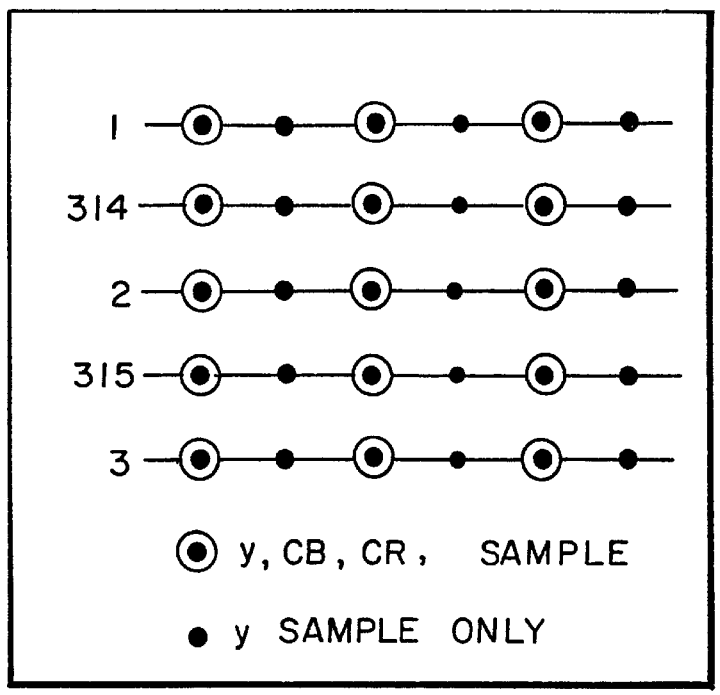
FIG. 1 is a schematic illustration of the positions of the Y,Cb,Cr sample sites on the scan lines of an interlaced picture, as used in the conventional 4:2:2 YCbCr format of the prior art.

FIG. 1 illustrates the positions of the Y,Cb,Cr sample sites on the scan lines of an interlaced picture, as utilized in the 4:2:2 YCbCr format, often used in consumer video applications. In this system each sample has a Y, a Cb, and a Cr value. For every two horizontal Y samples, there is one Cb and one Cr sample. Each sample typically has 8 bits per component in consumer applications or 10 bits per component in editing applications. If a frame buffer, which has all three color components for each pixel, is used, each sample in consumer applications therefore requires 16 bits per pixel or 20 bits for editing applications, usually formatted as shown in FIG. 2, where the pixel numbers are given after the dash line. For display, the Y samples for which no Cb and Cr data have been saved typically have to use interpolated Cb and Cr data from the previous and next samples that have the Cb and Cr data.

Figure 3:
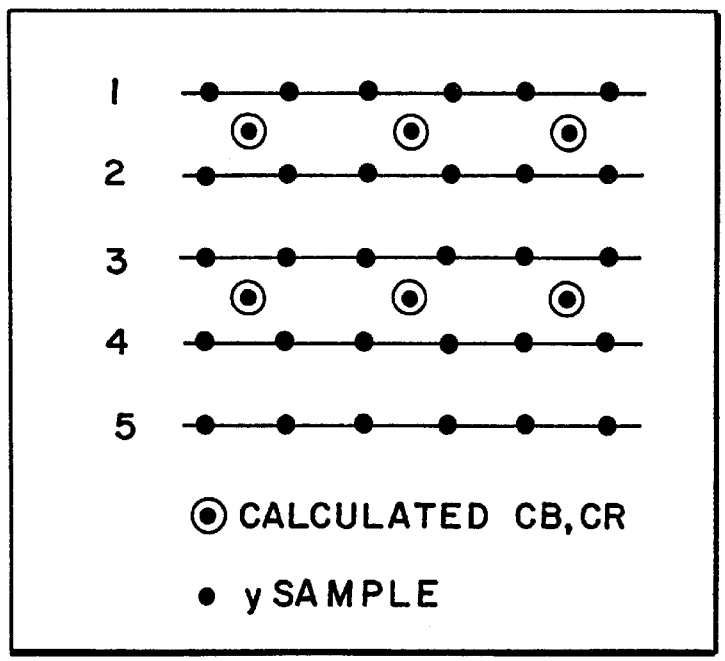
FIG. 3 is a schematic illustration of the positions of the Y,Cb,Cr sample sites on the scan lines of a non-interlaced picture, as used in the conventional 4:2:0 YCbCr format of the prior art.

FIG. 3 represents 4:2:0 coded picture sampling with the positions of the Y,Cb,Cr sample sites on the scan lines of a non-interlaced picture, as used in the 4:2:0 YCbCr format, utilized by the H.261 and H.263 video teleconferencing standards and the MPEG video compression standard. The 4:2:0 YCbCr format implements a 2:1 reduction of Cb and Cr in both the vertical and horizontal directions.

The video compression method implemented in the preferred embodiment of the present invention operates in the YCbCr 4:2:0 or 4:2:2 format mode and is applied to the 4:2:0 or 4:2:2 data stream, although it may operate in other color systems and format modes, as well. Because much better fidelity in the image can be preserved by not mixing together the color and brightness information, the method preferably operates on digital video cameras which have separate chrominance and luminance signals. Therefore the preferred method of the present invention operates in two separate domains, the Y (luminance) domain and the Cr/Cb (chrominance) domain.

Figure 4A:
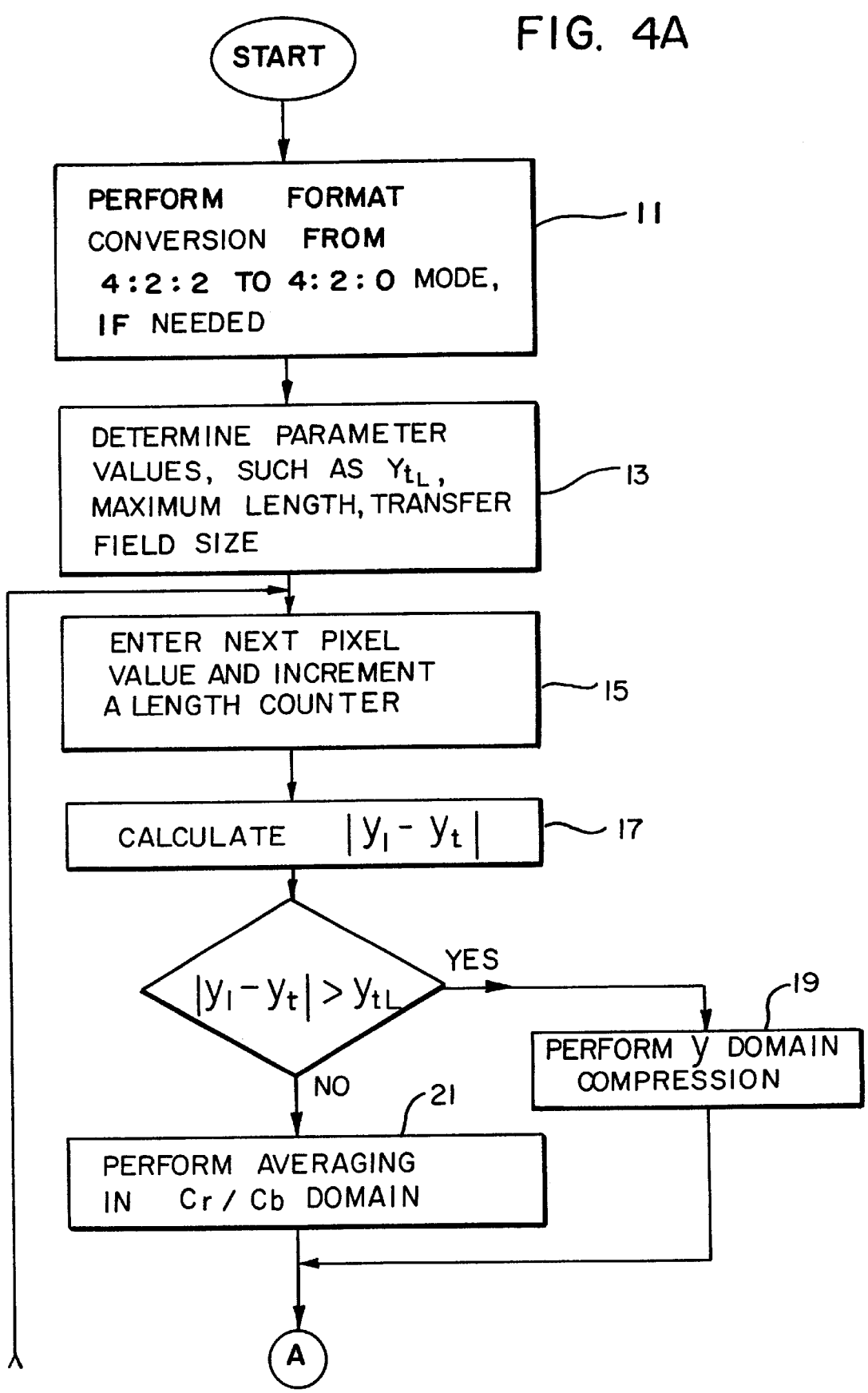
FIGS. 4A and 4B are schematic illustrations of the flow chart of a method embodiment of the present invention.
Figure 4B:
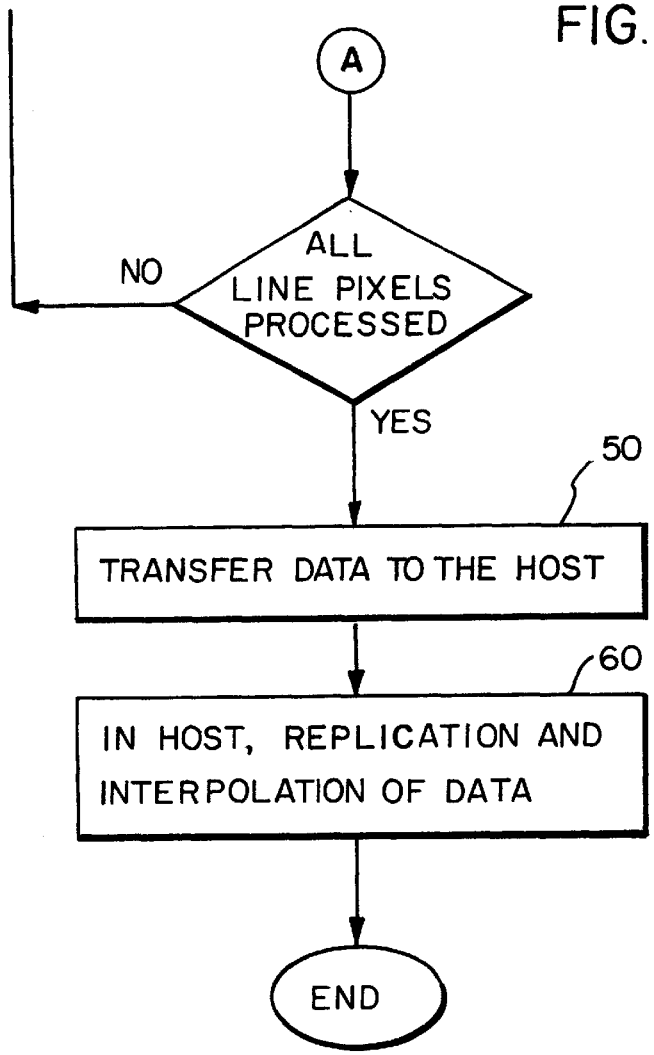

A flow chart of the preferred method of the present invention is shown in FIGS. 4A and 4B. The method operates on one video line at the time, and thus does not require lengthy frame buffers for its implementation. When applied in the Y domain the method operates in real-time and treats each horizontal video line as a separate entity, on a pixel-by-pixel basis. Therefore, in the Y domain there is no inter-frame or interline data correlation, because there is no need to save data before the transfer on a bus, and no line buffer is needed, thus saving space, cost and transfer time. The bus may be the Universal Serial Bus (USB) or another serial or parallel bus. The method is based on tagging pixels in a video line according to the differences in their luminance (Y) values. The value of a threshold for detecting a change in the luminance value between pixels can be predetermined and is programmable, as shown in step 13. The threshold value controls the image quality; the lower the threshold, the higher the image quality. In step 15 pixels' Y values are received one by one and pixels to be tagged are determined in step 17. The Y domain compression is performed in step 19.

Figure 5:
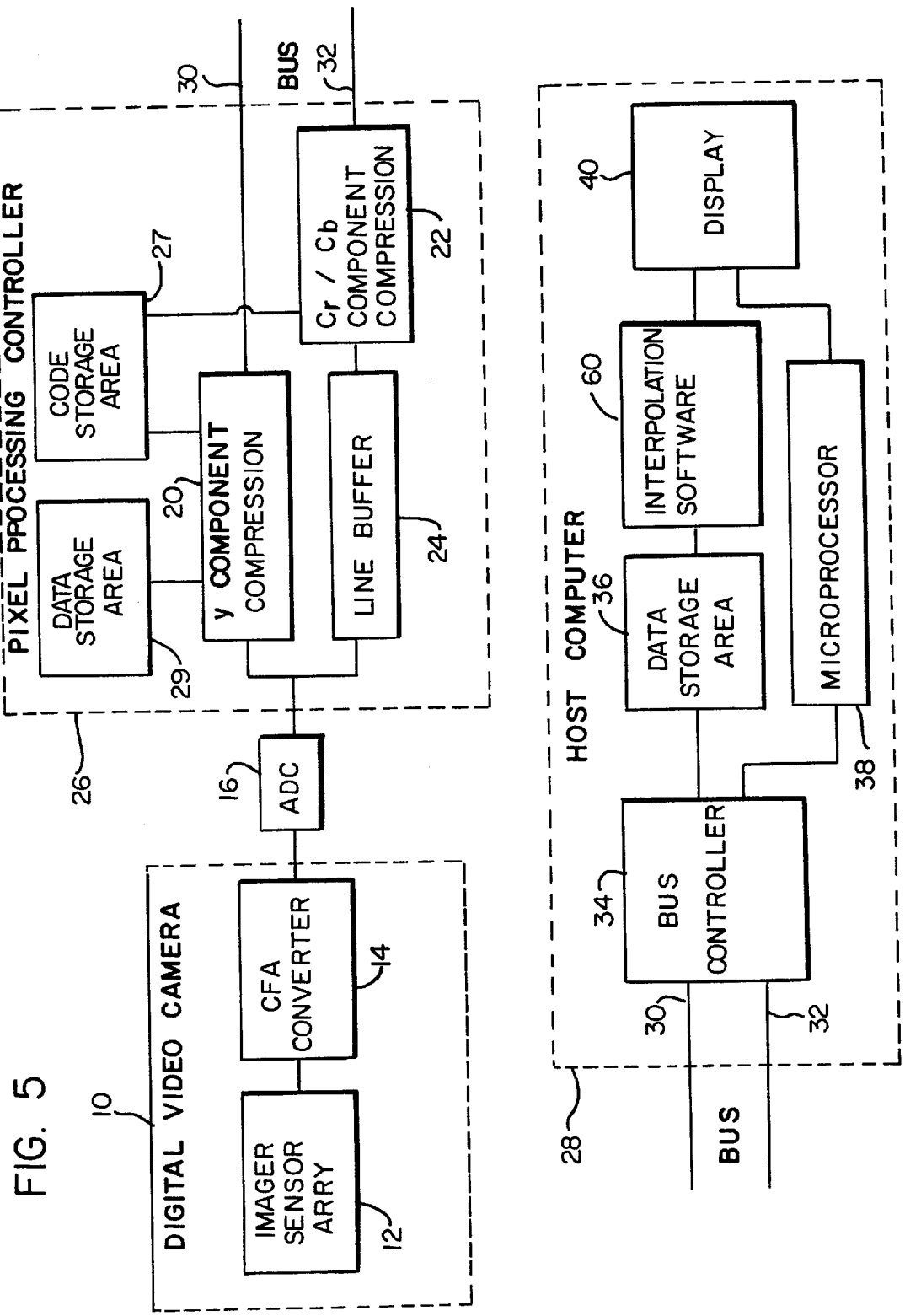
FIG. 5 is a schematic illustration of a digital video camera, a host, and a link between them, according to a preferred embodiment of the present invention.

In the Cr/Cb domain an averaging step 21 is used to obtain the averaged Cr and Cb values for a transfer video block. Thus, in the Cr/Cb domain, a line buffer 24, shown in FIG. 5, is needed by the averaging step 21 and is used to hold one or, at most, two lines of digitized pixel data. In addition, to avoid streaking in the displayed image, the maximum size of a transfer field, containing pixel information, is limited in the step 13 to a finite and programmable value.

The preferred method of the present invention is implemented within a digital video camera 10, attached to a host computer 28 via a bus 30, as shown in FIG. 5. The host computer 28 is preferably a personal computer, capable of handling fast calculations and storing large amounts of data.

The digital electronic camera 10 has an image sensor array 12, which may be covered with a color filter mosaic called a color filter array (CFA) 14. The method of the present invention may also be applied to monochrome cameras, in which case there is no Cr and Cb data.

In the digital video camera 10 the analog signal coming from the image sensor array 12 is digitized using an analog-to-digital converter 16. The digital video camera 10 of the invention contains its own Pixel Processing Controller (PPC) 26, which is preferably an Application Specific Integrated Circuit (ASIC) chip, which has a Y domain compression module 20 for tagging the pixel locations, and a Cr/Cb domain compression module 22 for averaging the Cr and Cb values. The PPC 26 may also be used, if needed, to transform the image data from the camera's color system (such as RGB) to another color system, such as YCbCr, in which the luminance and the chrominance values are separated, and to perform compression in the 4:2:2 or 4:2:0 format.

The PPC chip 26 has a limited-size on-board data storage area 29 to store a limited number of data values and parameters needed for the video compression. The size of the on-board data storage area 29 is directly related to a predetermined value chosen in the step 13 for the maximum number of pixels allowed between the tagged pixels, which has to be kept small to obtain good resolution, and is preferably only 8 to 16 pixels. After the compression, the data is transferred to the host computer 28 which has a bus controller 34, a microprocessor 38, and a data storage area 36. The host computer 28 has to perform data decompression and data transformation from the YCbCr domain into the RGB domain before displaying the video frames on a display 40.

Figure 6:
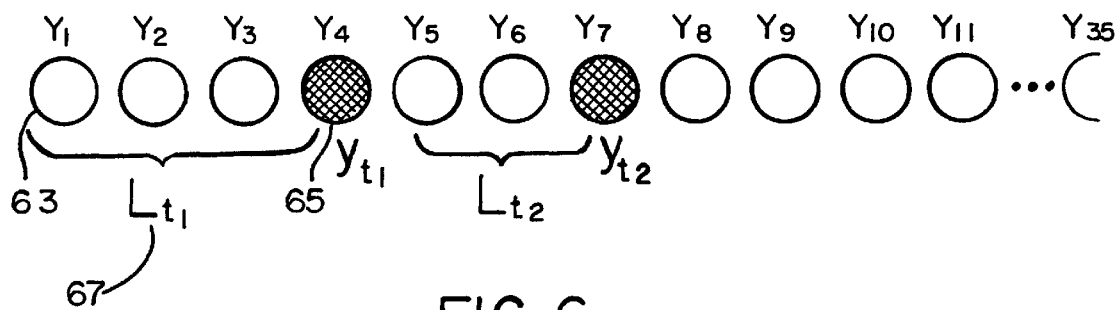
FIG. 6 is a schematic illustration of the tagging scheme performed in the Y domain on a single active video line of a CIF size video frame, according to a preferred embodiment of the present invention.

The preferred method of the present invention uses a Y domain compression algorithm and a Cr/Cb domain compression algorithm. FIG. 6 illustrates how the Y domain tagging is performed on a single active video line of a CIF-size video frame, according to the preferred method of the present invention. The active pixels on the line are indicated as incoming pixels 1 through 352, represented with the symbol $Y_i$. $Y_t$ represents the Y value for the previously tagged pixel. $L_t$ represents the length associated with the tagged pixel $Y_t$. The variable $L_t$ has the value obtained with a counter of the step 15 and represents the number of pixels since the last tagged pixel. $Y_{th}$ represents the threshold value used for tagging, preferably saved with the $Y_t$, and $L_t$ values in the camera data storage area 29.

The Y compression algorithm calculates the absolute value of the difference between an incoming pixel's $Y_i$ value and the $Y_t$ value of the previously tagged pixel in step 17. If the absolute value of the difference exceeds the threshold $Y_{th}$, preferably set by the host microprocessor 38, the $Y_i$ value for this incoming pixel and the number of pixels since the last tagged pixel (length $L_t$) are saved in the data storage area 29 of the camera PPC chip 26. This pixel becomes the new tagged pixel and the process is repeated for new pixels until the end of the current video line is reached. The tagged pixel luminance and length values are transmitted to the host computer 28 in step 50 where they are used in a decompression and interpolation software program 60 stored in the host data storage area 36, to reconstruct the video, through replication and/or interpolation of the values between the tagged pixels on the video line. The process is repeated for the next video line.

The host computer 28 receives the compressed video stream from the camera 10 and uses two algorithms in the interpolation software program 60 for decompressing and regenerating the original 4:2:0 or 4:2:2 image. These algorithms are applied to the Y domain and the Cr/Cb domain separately. Decompression in the Cr/Cb domain is a method opposite of the averaging method described below. In the Y domain, the decompression includes interpolation between the tagged pixels, which may be accomplished by copying a single pixel a number of times, based on the length value in the Y domain.

FIG. 6 illustrates a single active video line where blank circles represent incoming pixels $Y_i$ 63, chosen from a group of pixels $Y_1$–$Y_{352}$, and shaded circles represent tagged pixels $Y_{t1}$, $Y_{t2}$, 65. $L_{t1}$, and $L_{t2}$ represent values of the length 67 associated with each tagged pixel 65. For example, the tagged pixel $Y_{t1}$ has the length $L_{t1}$ of four because it has four pixels associated with it, while $Y_{t2}$ has the length $L_{t2}$ of three.

The goal of the video compression method of the present invention is to minimize the number of tagged pixels transmitted to the host as well as to shorten the transfer field size. Therefore, if the length for each tagged pixel is kept beyond 16 pixels it can be represented with a field of 4 bits. In order to further increase the maximum length size, the length representing the number of pixels in a run associated with a tagged pixel may be encoded in the camera 10, after the step 19, and decoded in the host computer 28. In addition, the actual implementation of the Y domain compression method of the present invention may require use of special limitations, such as regarding the beginning and end of the video line.

Figure 7:
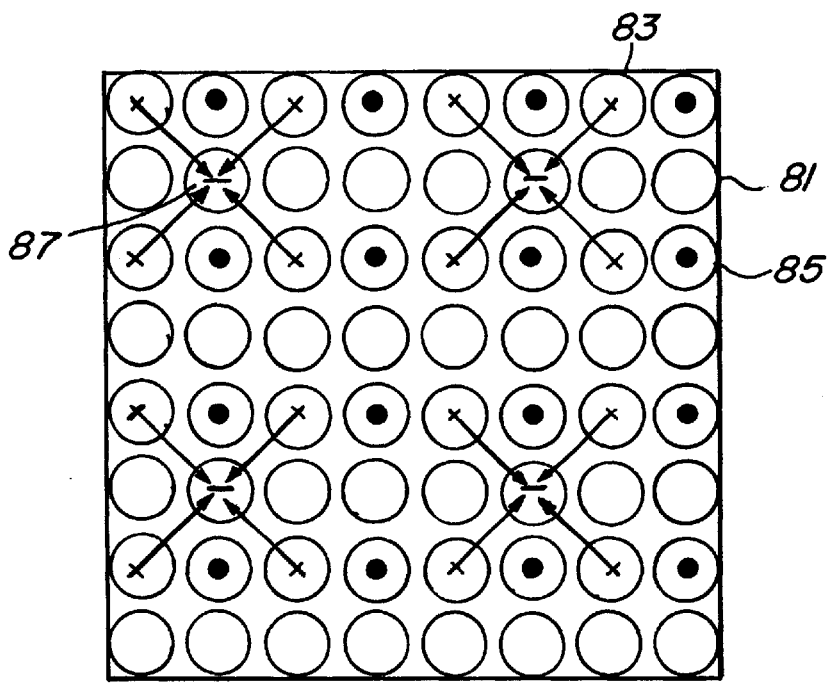
FIG. 7 is a schematic illustration showing the Cr averaging scheme performed in the Cr/Cb domain, according to a preferred embodiment of the present invention.
Figure 8:
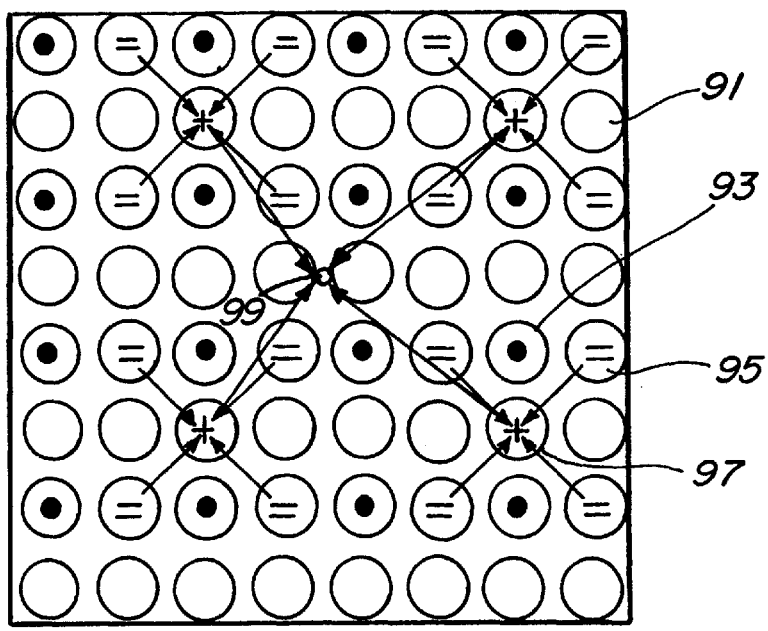
FIG. 8 is a schematic illustration showing the Cb averaging scheme performed in the Cr/Cb domain, according to a preferred embodiment of the present invention.

FIGS. 7 and 8 show the averaging scheme for the Cr/Cb domain, used in an averaging step 21, and performed in the Cr/Cb compression module 22 of the digital camera PPC 26. In the Cr/Cb domain a single Cr value is calculated as the average value for preferably four Cr values in the 4:2:0 format, and for eight Cr values in the 4:2:2 format. A single Cb value is calculated to represent all Cb values in a group of pixels. In a block of 8×8 pixels there are preferably sixteen Cb values in the 4:2:0 format, and thirty-two Cb values in the 4:2:2 format. Although the averaging reduces the precision of the color information, it is permissible in many types of video applications, as in video conferencing. If the data is in the 4:2:2 format, the 4:2:2 to 4:2:0 format compression has to be performed in a method step 11 of FIG. 4A on the Cr and Cb data. Y values do not change between the 4:2:2 and 4:2:0 formats.

The algorithm of the step 21 performs averaging within each region of the Cr/Cb domain, and obtains a single Cr and a single Cb value for each region. In the 4:2:0 format, in the Cr domain this ratio is preferably 4:1, because four Cr values are averaged into a single Cr value, and in the Cb domain the ratio is preferably 16:1, because sixteen Cb values are averaged into a single Cb value. In the 4:2:2 format, in the Cr domain this ratio is preferably 8:1, because eight Cr values are averaged into a single Cr value, and in the Cb domain the ratio is preferably 32:1, because thirty-two Cb values are averaged into a single Cb value. Therefore, the Cr/Cb domain averaging algorithm of step 21 needs the short line buffer 24 to save data for this compression scheme.

FIG. 7 illustrates the Cr domain, 4:2:0 format, 4:1 averaging of the present invention, wherein each blank circle represents a Y value 81, a circle with an "×" symbol represents a Cr value 83, each dark circle represents a Cb value 85, and each circle with a symbol "−" represents an average Cr value 87. In this method, four adjacent Cr values are used to generated a single averaged Cr value 87, as shown in FIG. 7. This calculated average Cr value 87 is sent to the host computer 28 in the step 50 and is used to reconstruct the Cr values for this region of the video line. The rest of the Cr values for the video frame is calculated in the same manner.

FIG. 8 illustrates the Cb domain, 4:2:0 format, 16:1 averaging of the present invention wherein each blank circle represents a Y value 91, each dark circle represents a Cr value 93, a circle with a symbol "=" represents a Cb value 95, each circle with a symbol "+" represents a partial average Cb value 97, and each light-shaded circle represents an average Cb value 99. Four adjacent Cb values are used to generated a single intermediate averaged Cb value 97, as shown in FIG. 8. This intermediate value 97 is averaged with three other values calculated similarly and the result is sent to the host computer 28 and used to reconstruct the Cb values for this region of the video line. The rest of the Cb values for the video frame are calculated in the same manner.

The data obtained with the preferred method of the present invention may be further compressed by concatenating and/or encoding the information. For example, in the Y domain, because every tagged pixel in the image is preferably represented with an 8-bit Y value and the length with a 4-bit length value, the two 4-bit length codes for two pixels may be concatenated into a single byte. A similar method may be used in the Cr/Cb domain, because the number of Cr and Cb values for every frame is constant and known, and there are 88 Cr values in each of 72 Cr lines per frame, and there are 44 Cb values in each of 36 Cb lines per frame. The compressed Cr/Cb format for a full video frame, according to the Cr/Cb compression algorithm of the present invention, may have the alternative Cr-only and Cr/Cb lines, where each Cr-only line has only Cr values, and is followed by the Cr/Cb line of alternating Cr and Cb values.

The principles of the present invention have been proven by experimentation, using the preferred embodiments of the present invention and compared with the conventional video compression methods. The obtained results have proven the feasibility and superiority of the present invention. The method of the invention was applied to a digital video camera with the USB bus working in an isochronous traffic mode. The USB bus is an isochronous bus which has two isochronous pipes with guaranteed, regularly scheduled, transfer of digital data. The bus pipes may be used to separately transmit compressed or uncompressed Y and Cr/Cb data, one domain per each pipe.

The preferred method of the present invention has been applied to the USB-based digital video camera. The USB-based digital video camera typically contains an external buffer memory and may support three different modes: with no external buffer memory, with an external buffer memory of 32 Kbytes, and with an external buffer memory of 128 Kbytes. It has been confirmed that the video compression algorithm of the present invention allows the camera to transfer a higher number of frames to the host than do conventional methods, depending on the compression ratio and the USB bandwidth available. Furthermore, the data transfer of CIF-size frames between the camera and the host has been performed with the higher rate even without using an external frame buffer, or when only a smaller, 32K byte frame buffer is used.

The preferred method of the present invention is able to perform fast compression and decompression and enable real time transmission with a low average compression ratio of about 3:1 for moderately complex color images, as required for the USB bus, while preserving a high degree of image sharpness. With this method CIF-size video frames, having 352 pixels per line and 288 lines per frame, can be transmitted to the host at the average rate of between 20 and 30 frames per second, with good resolution. It should be noted however that, as with the other video compression algorithms, the actual achieved compression ratio depends on the amount of detail and motion in the particular video frame sequence. An additional benefit of the present invention includes the feature that allows the change of the compression ratio with the threshold value $Y_{th}$. Moreover, much higher compression ratios, such as 10:1, may be obtained when needed to squeeze image sequences through relatively low bandwidth transmission channels, such as for consumer delivery of moving images or when applied to applications that do not require very high quality, such as in video conferencing.

In another aspect of the present invention a frame rate control algorithm is implemented, which works in conjunction with the compression algorithm and allows the user to request a specific frame rate. The host computer 28, with the knowledge of the available bus bandwidth and the size of the host data storage area 36, calculates the required number of bytes per frame to achieve the selected frame rate. The host computer 28 then calculates and sets the value of the maximum length size, as well as the $Y_{th}$ value, and sends these parameters to the camera 10.

The preferred embodiments of the present invention are capable of producing digital imaging devices with a low gate count and power requirements, thus small, inexpensive, and yet capable of transferring 30 video frames per second.

Although illustrated on a USB-based digital video camera, are believed to be applicable to other types of still and video cameras which use silicone chips, such as CIF cameras using a CCD detector. It is understood that the principles of this invention are particularly applicable to low cost digital imaging devices which have to perform on-the-fly video compression and transmit samples on a bus with the limited data bandwidth, which must perform data interpolation before the image is further processed and displayed. Such devices may be office automation digital linear sensors, digital fingerprint detectors, digital scanners, digital broadcast television, compact disk video, multimedia, video conferencing systems, desktop face-to-face visual communications (videophone), dynamic medical imaging devices, high definition TV, video cassette recorders, copy machines, and fax machines.

Those skilled in the art will appreciate that various adaptations and modifications of the just-described preferred embodiment can be configured without departing from the scope and spirit of the invention. For instance, while the present invention has been described for the equipment using the USB bus, it is understood that the appropriately modified features of the present invention may be used to handle different buses and network channels, even wire optical fibers and broadcast channels. Furthermore, although shown on digital video cameras using the YCbCr system and CIF-size format, the present invention is equally applicable in the systems with other formats and color methods, for interlaced or non-interlaced picture. Therefore, it is to be understood that, within the scope of the appended claims, the invention may be practiced other than as specifically described herein.

What is claimed is:

1. A video compression method for maximizing a throughput of digitized video data on a link between a digital solid-state imaging device and a host computer, comprising the steps of:

performing the luminance (Y) domain compression of the video data on a line-by-line basis without storing video data lines or video data frames by tagging pixels in the video line on a pixel-by-pixel basis, according to differences in their luminance values;

performing the chrominance (Cr/Cb) domain averaging of the video data on a region-by-region basis without storing video data frames, wherein the step of the Cr/Cb domain compression comprises the following steps:

obtaining a single Cr value for each four Cr values in the 4:2:0 format, and obtaining a single Cr value for each eight Cr values in the 4:2:2 format;

calculating a single average value for a plurality of Cb locations; and transmitting the average Cr and Cb values to the host computer; and wherein said Y and Cr/Cb domain compression steps are implemented in the digital solid-state imaging device hardware for real time link transmission of the compressed video data to the host computer.

2. A video compression method for maximizing a throughput of digitized video data on a link between a digital solid-state imaging device and a host computer, comprising the steps of:

performing the luminance (Y) domain compression of the video data on a line-by-line basis without storing video data lines or video data frames by tagging pixels in the video line on a pixel-by-pixel basis, according to differences in their luminance values;

performing the chrominance (Cr/Cb) domain averaging of the video data on a region-by-region basis without storing video data frames, wherein the step of the Cr/Cb domain compression comprises the following steps:

calculating a single average value for a plurality of Cr locations obtaining a single Cb value for each sixteen Cb values in the 4:2:0 format, and obtaining a single Cb value for each thirty-two Cb values in the 4:2:2 format; and transmitting the average Cr and Cb values to the host computer; and wherein said Y and Cr/Cb domain compression steps are implemented in the digital solid-state imaging device hardware for real time link transmission of the compressed video data to the host computer.

3. The video compression method of claim 2 wherein the step of calculating the single average value for the plurality of Cb locations comprises the following steps:

averaging four-by-four adjacent Cb values from a region to generate a single intermediate average Cb value for each said four Cb values; and averaging the intermediate average Cb values to obtain a single average Cb value.

4. In a digital video imaging device which works in the YCbCr 4:2:0 or 4:2:2 format and is attached to a host computer via a link, a pixel processing controller comprising:

a Y domain compression module for tagging pixel locations in the Y domain according to a predetermined criteria;

a Cr/Cb domain compression module for averaging the Cr and the Cb values in the Cr/Cb domain, wherein the Cr/Cb domain compression module is adapted to obtain a single Cr value for each four Cr values, and a single Cb value for each sixteen Cb values in the 4:2:0 format, and a single Cr value for each eight Cr values, and a single Cb value for each thirty-two Cb values in the 4:2:2 format; and in the Y domain a predetermined threshold value for detecting a change in the luminance value between pixels in a video line, and a predetermined value for maximum number of pixels allowed between the tagged pixels.

5. In a digital video imaging device which works in the YCbCr 4:2:0 or 4:2:2 format and is attached to a host computer via a link, a pixel processing controller comprising:

an image sensor array for obtaining luminance (Y) and chrominance (Cr, Cb) values of pixels in a video line;

a Y domain compression module for tagging pixel locations in the Y domain according to a predetermined criteria, the Y domain compression module adapted to determine pixels in the video line which are tagged on a pixel-by-pixel basis, according to differences in the pixel luminance values;

a Cr/Cb domain compression module for averaging the Cr and the Cb values in the Cr/Cb domain, the Cr/Cb domain compression module adapted to calculate a single average value for a plurality of Cr locations, and a single average value for a plurality of Cb locations;

in the Y domain a predetermined threshold value for detecting a change in the luminance value between pixels in a video line, and a predetermined value for maximum number of pixels allowed between the tagged pixels;

said link is a bandwidth-limited bus with isochronous pipes, wherein a first bus pipe transmits the Y domain values and a second bus pipe transmits the Cr/Cb domain values, and the digital imaging device is a solid-state camera working in isochronous traffic mode in the YCbCr 4:2:0 or 4:2:2 format, and the camera transmits to the host computer the tagged pixel luminance values and lengths between the tagged pixels;

the Cr/Cb domain compression module is adapted to obtain a single Cr value for each four Cr values, and a single Cb value for each sixteen Cb values in the 4:2:0 format, and a single Cr value for each eight Cr values, and a single Cb value for each thirty-two Cb values in the 4:2:2 format;

said compressed data are encoded and codes are concatenated separately in the Y domain and in the Cr/Cb domain, before the transmission to the host computer; and said concatenation in the Cr/Cb domain produces alternative Cr-only lines and Cr/Cb lines, where each Cr-only line has only Cr values, and each Cr/Cb line has alternating Cr and Cb values.

* * * * *